United States Patent
Won et al.

(10) Patent No.: US 9,062,253 B2
(45) Date of Patent: Jun. 23, 2015

(54) PHOSPHOR COMPOSITION, LIGHT EMITTING DEVICE, AND THE METHOD OF PREPARING THE PHOSPHOR COMPOSITION

(71) Applicant: SAMSUNG ELECTRONICS CO., LTD., Suwon-si, Gyeonggi-do (KR)

(72) Inventors: Hyong Sik Won, Gyeonggi-do (KR); Youn Gon Park, Gyeonggi-do (KR); Seong Min Kim, Chungcheonnam-do (KR); Chan Suk Min, Gyeonggi-do (KR); Sung Hak Jo, Gyeongsangbuk-do (KR); Chul Soo Yoon, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 280 days.

(21) Appl. No.: 13/708,553

(22) Filed: Dec. 7, 2012

(65) Prior Publication Data
US 2013/0147343 A1 Jun. 13, 2013

(30) Foreign Application Priority Data
Dec. 9, 2011 (KR) .................. 10-2011-0131967

(51) Int. Cl.
| | |
|---|---|
| C09K 11/79 | (2006.01) |
| H01L 33/00 | (2010.01) |
| C09K 11/77 | (2006.01) |
| C09K 11/08 | (2006.01) |
| H01L 33/50 | (2010.01) |

(52) U.S. Cl.
CPC .......... *C09K 11/7792* (2013.01); *C09K 11/7774* (2013.01); *C09K 11/0883* (2013.01); *C09K 11/7766* (2013.01); *C09K 11/7783* (2013.01); *H01L 33/502* (2013.01)

(58) Field of Classification Search
USPC ...................... 252/301.4 F; 313/305; 257/98
See application file for complete search history.

(56) References Cited

U.S. PATENT DOCUMENTS

2013/0140490 A1* 6/2013 Fujinaga et al. ........ 252/301.4 F

FOREIGN PATENT DOCUMENTS

| | | |
|---|---|---|
| JP | 2004-059767 A | 2/2004 |
| JP | 2005-353888 A | 12/2005 |
| JP | 2010-095728 A | 4/2010 |
| WO | WO 2012/017949 * | 2/2012 |

* cited by examiner

*Primary Examiner* — Carol M Koslow
(74) *Attorney, Agent, or Firm* — McDermott Will & Emery LLP

(57) ABSTRACT

There are provided a phosphor and a light emitting device. The phosphor includes a phosphor composition including a rare-earth element employed in a compound represented by the equation: $L_3Si_6N_{11}$, wherein L is one or more elements selected from La, Y, Gd and Lu, the rare-earth element is one or more elements selected from Mn, Ce, Pr, Nd, Sm, Eu, Gd, Dy, Tb, Ho, Er, Tm and Yb. The phosphor composition is provided in particle form. The particle has at least a portion of a plane perpendicular to a [001] direction to be flat thereon so as to have a crystal plane.

16 Claims, 3 Drawing Sheets

PHOSPHOR COMPOSITION, LIGHT EMITTING DEVICE, AND THE METHOD OF PREPARING THE PHOSPHOR COMPOSITION

CROSS-REFERENCE TO RELATED APPLICATIONS

This application claims priority to Korean Patent Application No. 10-2011-0131967 filed on Dec. 9, 2011, in the Korean Intellectual Property Office, the disclosure of which is incorporated herein by reference.

TECHNICAL FIELD

The present application relates to a phosphor composition and a light emitting device.

BACKGROUND

A white LED device, the use of which has recently increased in a general illumination device, a liquid crystal diode (LCD) backlight, vehicle headlights, and the like. The white LED device generally includes a light emitting diode (LED) device emitting blue or near-ultraviolet light and a phosphor converting a light wavelength to visible light by using light emitted from the light emitting device as an excitation source.

In a method for implementing such a white LED according to the related art, as a light emitting device, a blue light emitting diode formed using a InGaN-based material having a wavelength of 450 to 550 nm may be used, and as a phosphor, a YAG-based phosphor emitting yellow light, represented by a compositional formula of $(Y,Gd)_3(Al,Ga)_5O_{12}$ may be representatively used. The white LED device allows blue light emitted from a light emitting device to be transmitted through a phosphor layer such that the absorption and scattering thereof are repeated several times within the phosphor layer, and a portion of blue light incident on and absorbed by phosphors in the phosphor layer during this process is mixed with wavelength-converted yellow light, whereby it is perceived as white to the human eye. However, in the case of an oxide-based phosphor such as a silicate or the like, in general, when an excitation source wavelength exceeds 400 nm, since there is a tendency for a decrease in light emission strength, it may not be appropriate for producing relatively highly bright white light by using blue light. In a garnet-based phosphor, represented by YAG, excellent excitation efficiency and light emission efficiency may be provided in blue light, while light emitting efficiency at a relatively high temperature may be reduced.

A nitride-based phosphor, for example, a so-called LSN phosphor having a compositional formula of $La_3Si_6N_{11}$, has recently been reported and has excellent characteristics in terms of high temperature characteristics and reliability. However, in the case of an LSN phosphor, there is still a need to develop a phosphor having improved efficiency in order to replace commercialized phosphors of the related art.

SUMMARY

An aspect of the present application provides a phosphor having excellent high temperature characteristics, reliability and improved light emission efficiency, and a light emitting device including the same.

According to an aspect of the present application, there is provided a phosphor having a composition including a rare-earth element or manganese (Mn) employed in a mother compound represented by a general equation: $L_3Si_6N_{11}$, L being one or more elements selected from a group consisting of lanthanum (La), yttrium (Y), gadolinium (Gd) and lutetium (Lu). The rare-earth element is one or more elements selected from a group consisting of cerium (Ce), praseodymium (Pr), neodymium (Nd), samarium (Sm), europium (Eu), gadolinium (Gd), dysprosium (Dy), terbium (Tb), holmium (Ho). erbium (Er), thulium (Tm), and ytterbium (Yb), The composition is provided in the form of a particle, and the particle has at least a portion of a plane perpendicular to a [001] direction to be flat thereon so as to have a crystal plane.

The particle may have a flat shape in which 50% or more of the plane thereof perpendicular to the [001] direction has the crystal plane.

The particle may have a flat shape in which at least a portion of a plane perpendicular to another direction different from the [001] direction has the crystal plane.

In the particle, a ratio of a length of the plane thereof perpendicular to the [001] direction to that of the plane perpendicular to another direction different from the [001] direction ranges from 1:3 to 3:1.

The rare-earth element may be Ce or Eu.

The phosphor may be characterized in that a central wavelength from a light emission spectrum is 520 nm or more when ultraviolet light or blue light is used as an excitation source.

According to another aspect of the present application, there is provided a light emitting device which emits excitation light. A wavelength conversion unit absorbs the excitation light to emit visible light. The wavelength conversion unit includes a phosphor composition including a rare-earth element or manganese (Mn) employed in a mother compound represented by a general equation: $L_3Si_6N_{11}$, L being one or more elements selected from a group consisting of lanthanum (La), yttrium (Y), gadolinium (Gd) and lutetium (Lu). The rare-earth element is one or more elements selected from a group consisting of cerium (Ce), praseodymium (Pr). neodymium (Nd), samarium (Sm), europium (Eu), gadolinium (Gd), dysprosium (Dy), terbium (Tb), holmium (Ho), erbium (Er), thulium (Tm), and ytterbium (Yb). The composition is provided in the form of a particle. The particle has at least a portion of a plane perpendicular to a [001] direction to be flat thereon so as to have a crystal plane.

The light emitting device may be an ultraviolet light emitting diode or a blue light emitting diode.

The particle may have a flat shape in which 50% or more of the plane thereof perpendicular to the [001] direction has the crystal plane.

The particle may have the flat shape in which at least a portion of a plane perpendicular to another direction different from the [001] direction has the crystal plane.

The particle may have a ratio of 1:3 to 3:1 in a length of the plane perpendicular to the [001] direction to that of the plane perpendicular to the direction different from the [001] direction.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other aspects, features and other advantages of the present application will be more clearly understood from the following detailed description taken in conjunction with the accompanying drawings, in which.

DETAILED DESCRIPTION

Figure 1:
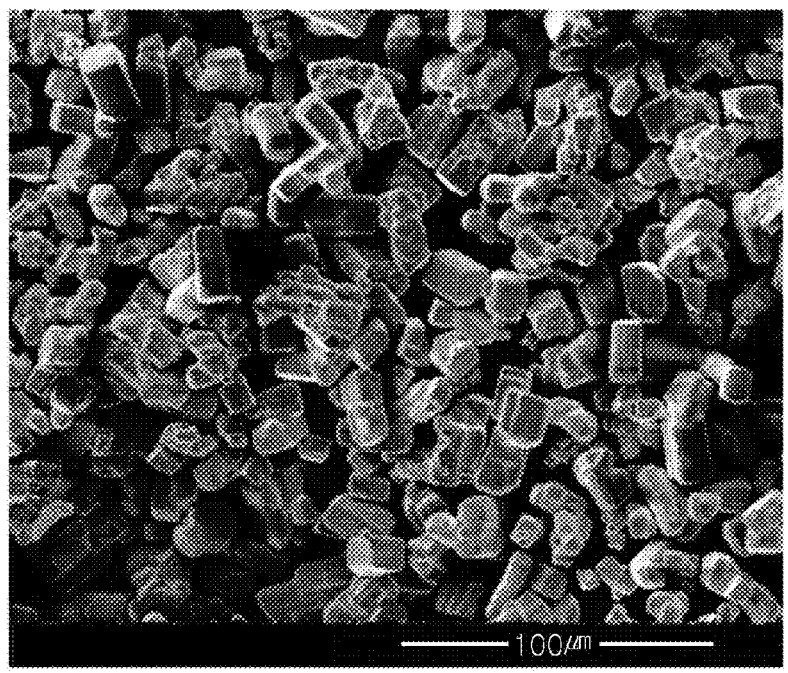
FIGS. 1, 2 and 3 are SEM images of a phosphor captured using a scanning electron microscope (SEM) at respective magnifications of 500×, 1000× and 3000×, according to an example of the present application.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Hereinafter, examples of the present application will be described in detail with reference to the accompanying drawings. The inventive concepts may, however, be exemplifies in many different forms and should not be construed as being limited to the specific examples set forth herein. Rather, these examples are provided so that this disclosure will be thorough and complete, and will fully convey the scope of the inventive concepts to those skilled in the art.

In the drawings, the shapes and dimensions of elements may be exaggerated for clarity, and the same reference numerals will be used throughout to designate the same or like elements.

A phosphor according to an example of the present application may include a composition (hereinafter, referred to as an ISN phosphor composition') in which a rare-earth element or manganese (Mn) is employed in a mother (i.e. starting or initial) compound represented by a general equation: $L_3Si_6N_{11}$, wherein L is one or more elements selected from a group consisting of lanthanum (La), yttrium (Y), gadolinium (Gd) and lutetium (Lu). The rare-earth element is one or more elements selected from a group consisting of cerium (Ce), praseodymium (Pr), neodymium (Nd), samarium (Sm), europium (Eu), gadolinium (Gd), dysprosium (Dy), terbium (Tb), holmium (Ho), erbium (Er), thulium (Tm), and ytterbium (Yb). The composition may be provided in the form of a particle. The particle may have at least a portion of a plane thereof perpendicular to a [001] direction to be flat thereon so as to have a crystal plane.

Figure 2:
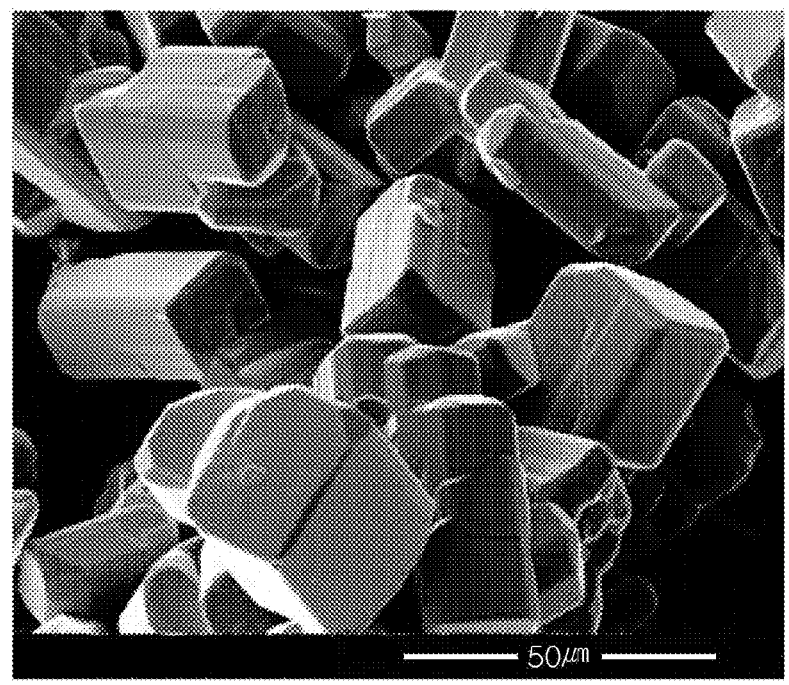
Figure 3:
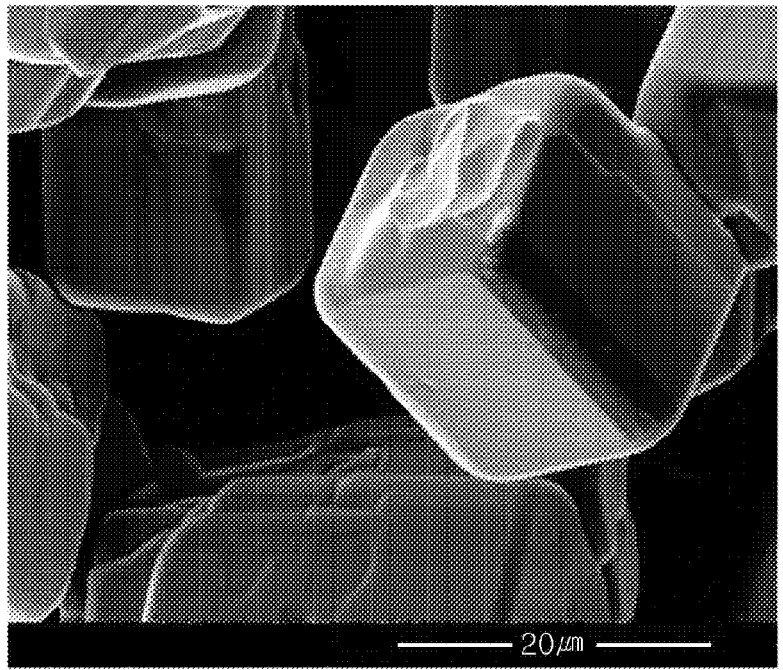

In the case of a phosphor proposed according an example of the present application, as illustrated in SEM images of FIGS. 1 to 3, the phosphor includes a composition obtained by adding a rare-earth element such as Ce, Eu or the like, to an LSN phosphor as an activator. In a case in which the phosphor is provided in the form of a particle, at least one plane thereof may have a crystal plane and thus have a planar shape. In this case, the plane may be defined as a plane perpendicular to the [001] direction. However, the entire plane perpendicular to the [001] direction may not necessarily be flat, and could be within the category of a flat shape intended according to a present example as long as 50% or more of the plane perpendicular to the [001] direction has a crystal plane.

In addition, in the LSN phosphor particle according to the present example, a different plane in addition to the plane perpendicular to the [001] direction may also have a crystal plane to thus have a flat shape. For example, in the case of the LSN phosphor particle, at least a portion of a plane perpendicular to another direction different from the [001] direction may have a crystal plane and thus have a planar shape. By this configuration, the LSN phosphor particle may have a roughly hexahedral overall shape, as shown in FIGS. 1 to 3. In the case of a similar rectangular parallelepiped shape as described above, a ratio of a length of the plane perpendicular to the [001] direction to that of a plane perpendicular to another direction different from the [001] direction may range from 1:3 to 3:1.

Figure 4:
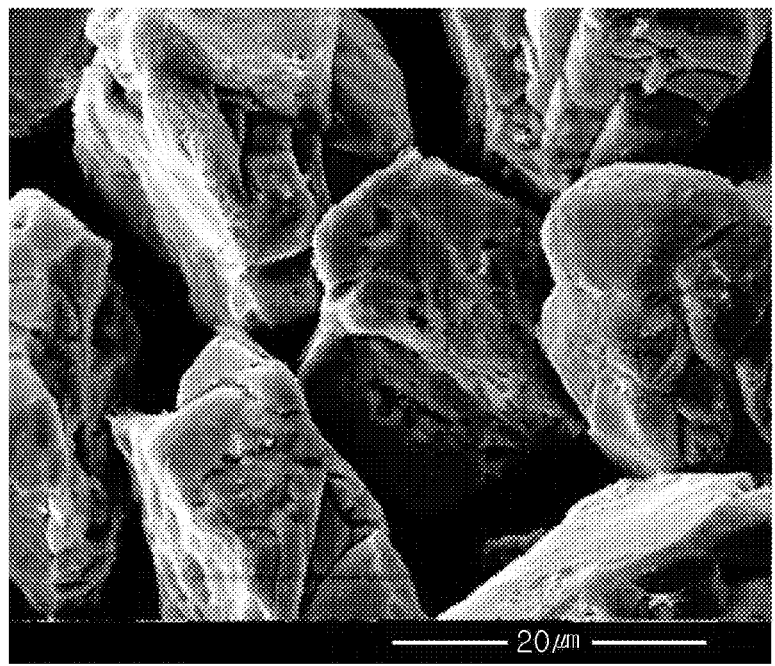
FIG. 4 is an SEM image of a phosphor according to a comparative example at a magnification of 3000×.

In the LSN phosphor according to an example of the present application, it can be seen through experimentation that light emission efficiency thereof may be improved when a phosphor particle has a structure in which it has a crystal plane maintained as in accordance with the present example. That is, the LSN phosphor according to the present example provide excellent light emission efficiency as compared with an LSN phosphor provided in a form of a particle having an irregular surface as shown in the comparative example of FIG. 4. The irregular surface of the LSN phosphor as illustrated in FIG. 4 may be generated due to an LSN crystal being unstably formed during a phosphor synthesis process or a basic form of a particle being broken during a pulverization process. In a case in which a phosphor particle has an irregular particle form, since a number of combinations may be included in a plane or an inner portion of a phosphor particle, light emission efficiency may be deteriorated and the quality thereof may be degraded in the case of extended use. According to the present example, therefore, light emission efficiency and reliability is increased through an LSN particle in a form in which the breakage on a crystal plane is significantly reduced.

Figure 5:
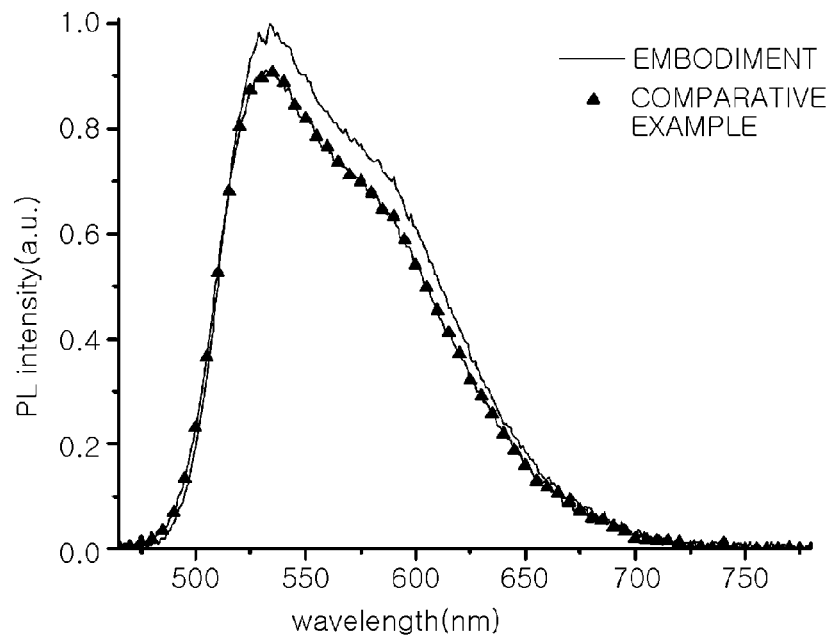
FIG. 5 is a graph illustrating examples of light emission spectrums of light wavelength-changed by phosphors according to an example of the present application and a comparative example.

With reference to FIG. 5, light emission characteristics (excitation wavelength at or around 450 nm) according to a particle form of the LSN phosphor will now be described. In an example where the LSN phosphor particle is provided with a flat shape while having a crystal plane, it is confirmed that photo luminance (PL) intensity is increased approximately 7%, as compared with a comparative example having a particle form as illustrated in FIG. 4. In this case, a particle size of about 20 μm was provided, based on D50, in both of the phosphors according to the present example and the examples compared therewith.

Figure 6:
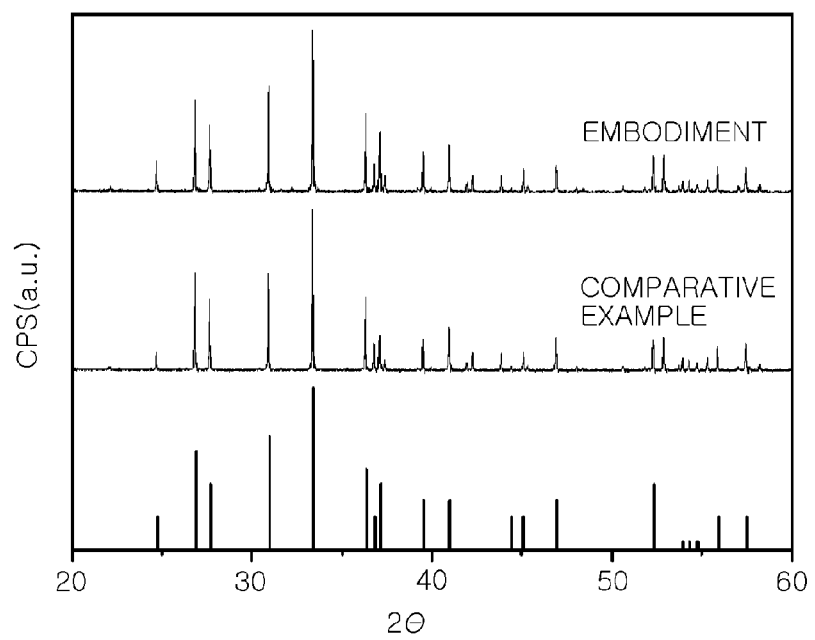
FIG. 6 illustrates examples of an X-ray diffraction (XRD) phosphor pattern according to an example of the present application and a comparative example.

In addition, as shown in FIG. 6, it is confirmed that there was little substantial difference between a $La_3Si_6N_{11}$ crystal in a lowermost part of FIG. 6 and both phosphors according to the present examples and the comparative example through an x-ray diffraction (XRD) pattern.

On the other hand, the LSN phosphor proposed in the present example has excellent light emission efficiency and reliability in yellow, orange or other bands adjacent thereto when ultraviolet light or visible light is irradiated on an excitation source, and thus, may be appropriately used as a phosphor for a light emitting device such as a light emitting diode or the like, as a wavelength conversion unit. For example, when the phosphor uses ultraviolet light or blue light as an excitation source, a central wavelength in a light emitting spectrum may be about 520 nm or more. By using these light emitting device and phosphor composition, a light emitting device, specifically, a light emitting device allowing for white light to be emitted, may be implemented.

A method of manufacturing an LSN phosphor having a particle form as described above will be described hereinafter, being based on a composition in which La is used as an L element and Ce is used as an active agent. However, other elements besides La and Ce may be, and Al may be included such that a portion of Si may be substituted therewith. First, as an Si raw material, $Si_3N_4$ is used, as an L raw material, LaN is used, and as a Ce raw material, CeN is used, that is, they are respectively weighed and are then mixed, manually, mechanically, or the like. In order to reduce influence from oxygen, moisture, or the like at the time of the mixing of raw materials, the weighing and mixing are performed in an argon (Ar)-substituted glove box. In addition, although it is not necessarily required, in order to promote phosphor synthesis. $BaF_2$ is used as flux. In this case, the LSN phosphor according to the present example was obtained by weighing and mixing as shown in Table 1.

TABLE 1

| LaN | $Si_3N_4$ | CeN | $BaF_2$ | Total Mass (g) |
|---|---|---|---|---|
| 0.6049 | 0.3794 | 0.0156 | 0.0100 | 1.01 |

Subsequently, the mixture was synthesized at about 1600° C. under a $H_2/N_2$ mixture gas atmosphere for 10 hours, and thus, a phosphor having a particle form illustrated in FIGS. 1 to 3 was obtained.

As set forth above, according to the present examples, a phosphor having excellent high temperature characteristics and reliability and improved light emission efficiency is provided.

In addition, according to present examples described herein, a light emitting device having excellent light emission efficiency by including the phosphor as described above therein is provided.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A phosphor composition comprising:
a rare-earth element or manganese (Mn) employed in a compound represented by the following equation:

$L_3Si_6N_{11}$,

L being one or more elements selected from a group consisting of lanthanum (La), yttrium (Y), gadolinium (Gd) and lutetium (Lu),
the rare-earth element selected from one or more of: cerium (Ce), praseodymium (Pr), neodymium (Nd), samarium (Sm), europium (Eu), gadolinium (Gd), dysprosium (Dy), terbium (Tb), holmium (Ho), erbium (Er), thulium (Tm), and ytterbium (Yb),
wherein the composition is in a particle form, the particle having at least a portion of a plane perpendicular to a [001] direction to be flat thereon so as to have a crystal plane.

2. The phosphor composition of claim 1, wherein the particle has a flat shape in which 50% or more of the plane thereof perpendicular to the [001] direction has the crystal plane.

3. The phosphor composition of claim 1, wherein the particle has a flat shape in which at least a portion of a plane perpendicular to another direction different from the [100] direction has the crystal plane.

4. The phosphor composition of claim 3, wherein in the particle, a ratio of a length of the plane thereof perpendicular to the [001] direction to that of the plane perpendicular to another direction, different from the [001] direction ranges from 1:3 to 3:1.

5. The phosphor composition of claim 1, wherein the compound includes the rare-earth element, and the rare-earth element is Ce or Eu.

6. The phosphor composition of claim 1, wherein a central wavelength from a light emission spectrum of the phosphor is 520 nm or more when ultraviolet light or blue light is used as an excitation source.

7. A light emitting device comprising:
a light emitting device emitting excitation light; and
a wavelength conversion unit absorbing the excitation light to emit visible light,
the wavelength conversion unit including a phosphor composition, the phosphor composition including:
a rare-earth element or manganese (Mn) employed in a compound represented the following equation:

$L_3Si_6N_{11}$,

L being one or more elements selected from a group consisting of lanthanum (La), yttrium (Y), gadolinium (Gd) and lutetium (Lu),
the rare-earth element selected from one or more of: cerium (Ce), praseodymium (Pr), neodymium (Nd), samarium (Sm), europium (Eu), gadolinium (Gd), dysprosium (Dy), terbium (Tb), holmium (Ho), erbium (Er), thulium (Tm), and ytterbium (Yb),
wherein the phosphor composition is in particle form, the particle having at least a portion of a plane perpendicular to a [001] direction to be flat thereon so as to have a crystal plane.

8. The light emitting device of claim 7, wherein the light emitting device is an ultraviolet light emitting diode or a blue light emitting diode.

9. The light emitting device of claim 7, wherein the particle has a flat shape in which 50% or more of the plane thereof perpendicular to the [001] direction has the crystal plane.

10. The light emitting device of claim 7, wherein the particle has the flat shape in which at least a portion of a plane perpendicular to another direction different from the [100] direction has the crystal plane.

11. The light emitting device of claim 10, wherein the particle has a ratio of 1:3 to 3:1 in a length of the plane perpendicular to the [001] direction to that of the plane perpendicular to the direction different from the [001] direction.

12. A method of preparing a phosphor composition, the method comprising steps of:
mixing a Si raw material, an L element, and a rare-earth element or manganese (Mn) to form a mixture, wherein:
the rare-earth element is employed in a compound represented the following equation:

$L_3Si_6N_{11}$, the L element selected from a group consisting of lanthanum (La), yttrium (Y), gadolinium (Gd) and lutetium (Lu),
the rare-earth element selected from one or more of: cerium (Ce), praseodymium (Pr), neodymium (Nd), samarium (Sm), europium (Eu), gadolinium (Gd), dysprosium (Dy), terbium (Tb), holmium (Ho), erbium (Er), thulium (Tm), and ytterbium (Yb), at least one of the Si raw material and the L element including nitrogen (N); and synthesizing the mixture to form the $L_3Si_6N_{11}$ compound in a $H_2/N_2$ mixture gas atmosphere at a temperature of about 1600° C. for about 10 hours.

13. The method of claim 12, further comprising the step of: providing $BaF_2$ as a flux during the synthesizing step.

14. The method of claim 12, wherein the mixing step is performed in an argon-substituted glove box.

15. The method of claim 12, wherein the phosphor composition is in particle form.

16. The method of claim 12, wherein:
the mixing includes mixing the Si raw material, the L element, and the rare-earth element, and the rare-earth element is Ce or Eu, and
the Si raw material is $Si_3N_4$.

* * * * *